United States Patent
Yu et al.

(10) Patent No.: US 11,532,565 B2
(45) Date of Patent: *Dec. 20, 2022

(54) SYSTEM ON INTEGRATED CHIPS AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Chuei-Tang Wang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/201,917

(22) Filed: Mar. 15, 2021

(65) Prior Publication Data

US 2021/0202398 A1 Jul. 1, 2021

Related U.S. Application Data

(60) Continuation of application No. 16/422,710, filed on May 24, 2019, now Pat. No. 10,950,553, which is a
(Continued)

(51) Int. Cl.
| | |
|---|---|
| *H01L 23/66* | (2006.01) |
| *H01L 23/538* | (2006.01) |
| *H01L 21/48* | (2006.01) |
| *H01L 23/31* | (2006.01) |
| *H01L 23/498* | (2006.01) |
| *H01L 23/522* | (2006.01) |
| *H01L 25/065* | (2006.01) |
| *H01L 25/00* | (2006.01) |

(52) U.S. Cl.
CPC ........ *H01L 23/5389* (2013.01); *H01L 21/486* (2013.01); *H01L 21/4857* (2013.01); *H01L 23/3114* (2013.01); *H01L 23/49816* (2013.01); *H01L 23/5226* (2013.01); *H01L 23/5383* (2013.01); *H01L 23/5384* (2013.01); *H01L 23/5386* (2013.01); *H01L 23/66* (2013.01); *H01L 25/065* (2013.01); *H01L 25/50* (2013.01); *H01L 23/3128* (2013.01); *H01L 2223/6677* (2013.01); *H01L 2224/18* (2013.01); *H01L 2924/19105* (2013.01)

(58) Field of Classification Search
CPC ............. H01L 23/5389; H01L 21/4857; H01L 21/486
See application file for complete search history.

(56) References Cited

U.S. PATENT DOCUMENTS

| | | | |
|---|---|---|---|
| 6,343,019 B1 | 1/2002 | Jiang et al. | |
| 7,119,745 B2 | 10/2006 | Gaucher et al. | |

(Continued)

*Primary Examiner* — Thao P Le
(74) *Attorney, Agent, or Firm* — Slater Matsil, LLP

(57) ABSTRACT

A semiconductor device and methods of forming are provided. The device includes a second die bonded to a first die and a third die bonded to the first die. An isolation material extends along sidewalls of the second die and the third die. A through via extends from the first die into the isolation material. A first passive device disposed in the isolation material, the first passive device being electrically connected to the first die.

20 Claims, 19 Drawing Sheets

Related U.S. Application Data division of application No. 15/650,495, filed on Jul. 14, 2017, now Pat. No. 10,332,841.

(60) Provisional application No. 62/364,546, filed on Jul. 20, 2016.

(56) References Cited

U.S. PATENT DOCUMENTS

| | | |
|---|---|---|
| 7,372,408 B2 | 5/2008 | Gaucher et al. |
| 7,564,115 B2 | 7/2009 | Chen et al. |
| 7,633,165 B2 | 12/2009 | Hsu et al. |
| 7,825,024 B2 | 11/2010 | Lin et al. |
| 7,955,942 B2 | 6/2011 | Pagaila et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,779,564 B1 | 7/2014 | Knudsen et al. |
| 8,802,504 B1 | 8/2014 | Hou et al. |
| 8,803,292 B2 | 8/2014 | Chen et al. |
| 8,803,316 B2 | 8/2014 | Lin et al. |
| 9,559,081 B1 | 1/2017 | Lai et al. |
| 10,224,217 B1* | 3/2019 | Kim .................. H01L 23/49816 |
| 2005/0093669 A1 | 5/2005 | Ahn et al. |
| 2006/0131959 A1 | 6/2006 | Nishijima et al. |
| 2008/0135977 A1 | 6/2008 | Meyer et al. |
| 2008/0149381 A1 | 6/2008 | Kawagishi et al. |
| 2008/0259585 A1 | 10/2008 | Fujii |
| 2009/0051025 A1 | 2/2009 | Yang et al. |
| 2012/0168963 A1 | 7/2012 | Huang et al. |
| 2013/0001795 A1 | 1/2013 | Lim et al. |
| 2013/0037950 A1 | 2/2013 | Yu et al. |
| 2014/0001645 A1 | 1/2014 | Lin et al. |
| 2014/0015131 A1 | 1/2014 | Meyer et al. |
| 2014/0110841 A1 | 4/2014 | Beer et al. |
| 2014/0152509 A1 | 6/2014 | Liu et al. |
| 2014/0167263 A1* | 6/2014 | Wu ....................... H01L 21/565 257/773 |
| 2014/0217610 A1 | 8/2014 | Jeng et al. |
| 2014/0225258 A1 | 8/2014 | Chiu et al. |
| 2014/0252572 A1 | 9/2014 | Hou et al. |
| 2015/0171013 A1 | 6/2015 | Liao |
| 2015/0171033 A1 | 6/2015 | Seler et al. |
| 2015/0179609 A1 | 6/2015 | Holm et al. |
| 2015/0318246 A1 | 11/2015 | Yu et al. |
| 2015/0318267 A1 | 11/2015 | Yu et al. |
| 2016/0071818 A1 | 3/2016 | Wang et al. |
| 2016/0111364 A1 | 4/2016 | Liao |
| 2016/0190113 A1* | 6/2016 | Sharan .................. H01L 21/78 257/532 |
| 2016/0247780 A1 | 8/2016 | Seler et al. |
| 2016/0358888 A1 | 12/2016 | Chang et al. |
| 2016/0358897 A1 | 12/2016 | Albers et al. |
| 2017/0018531 A1* | 1/2017 | Lin .................. H01L 23/49827 |
| 2017/0213800 A1 | 7/2017 | Seler et al. |
| 2017/0221838 A1 | 8/2017 | Chen et al. |
| 2017/0237167 A1 | 8/2017 | Ohno et al. |
| 2017/0263519 A1 | 9/2017 | Yu et al. |

\* cited by examiner

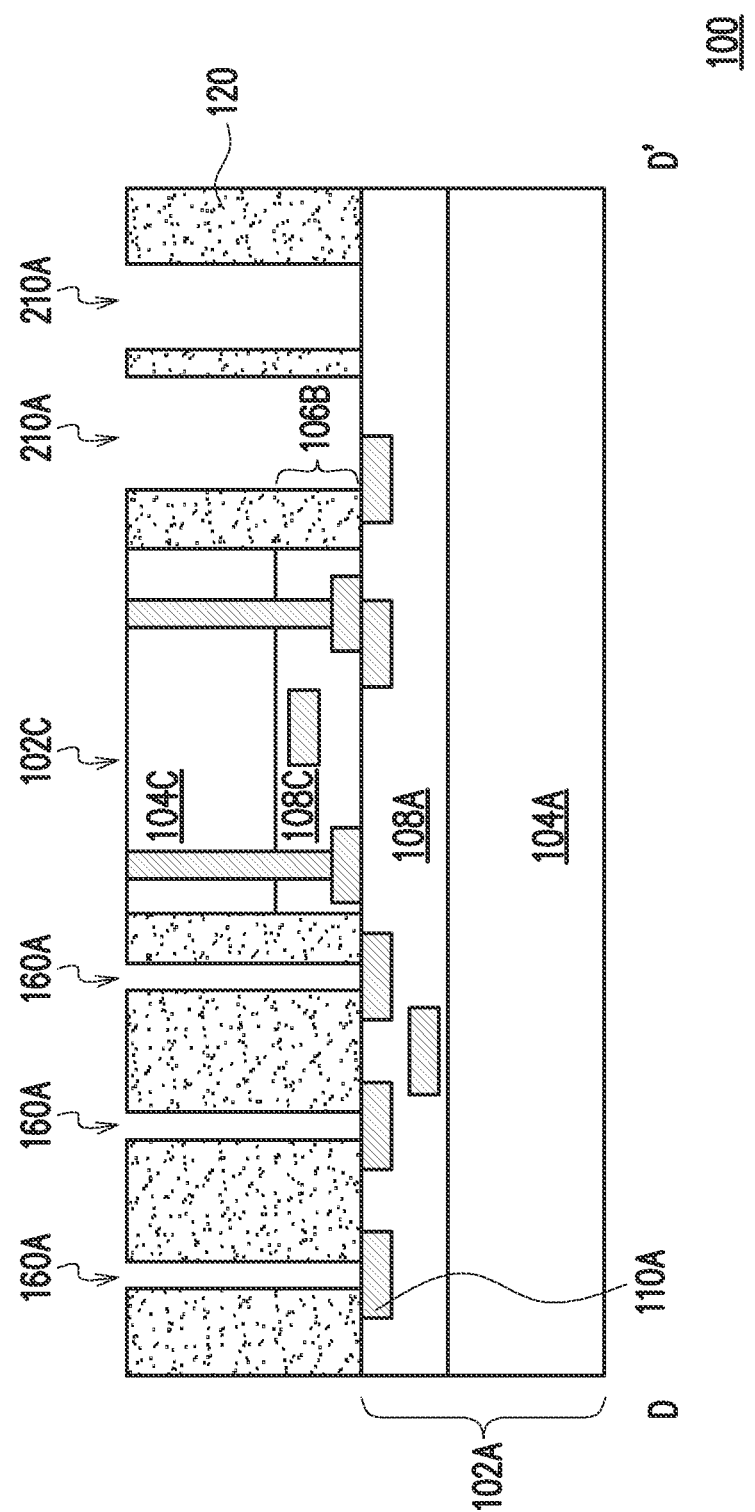

SYSTEM ON INTEGRATED CHIPS AND METHODS OF FORMING THE SAME

PRIORITY CLAIM AND CROSS-REFERENCE

This is a continuation of U.S. patent application Ser. No. 16/422,710, filed May 24, 2019, which is a division of U.S. patent application Ser. No. 15/650,495, filed Jul. 14, 2017, now U.S. Pat. No. 10,332,841, issued Jun. 25, 2019, which claims priority to U.S. Provisional Application No. 62/364,546, filed on Jul. 20, 2016, all of which are hereby incorporated by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A through 6F are cross-sectional views of a semiconductor package in accordance with some embodiments.

DETAILED DESCRIPTION

Figure 1:
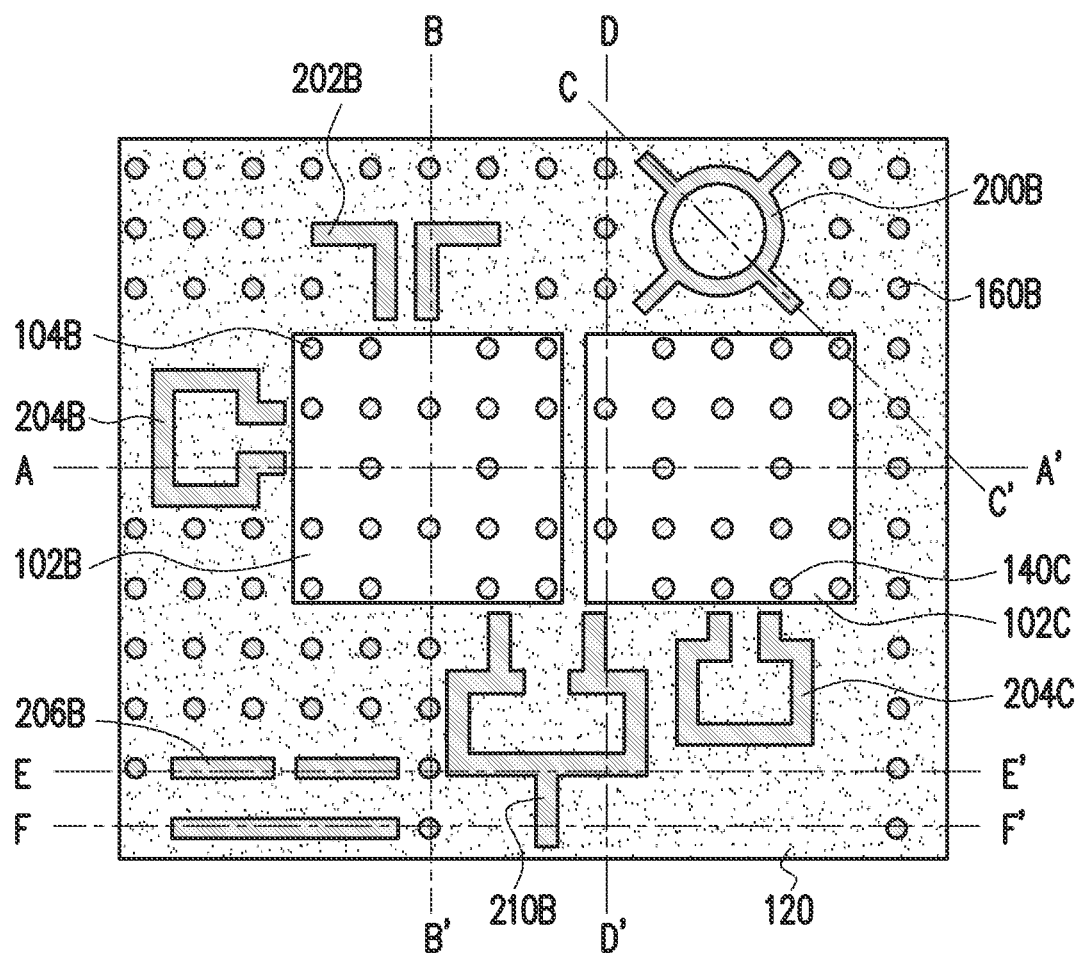
FIG. 1 is a plan view of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

System on integrated chip semiconductor packages having improved passive devices, and methods of forming, are provided. Various embodiments integrate multiple functional chips in a single device package and implement Chip-to-Wafer (e.g., known good die) for Chip-on-Wafer (CoW) level packaging. Functional chips may be directly bonded to other functional chips (e.g., by hybrid bonding), for example in order to reduce the need to form solder bumps (e.g., microbumps) and underfill. In accordance with some embodiments, passive devices may be integrated in the package and formed in a same isolation material as one or more through vias and/or one or more dies. Passive devices formed in the same isolation material as one or more through vias and/or one or more dies, as described herein, may result in passive devices with improved performance without significantly increasing a size of the semiconductor package.

Referring to FIG. 1, a plan view of a package 100 is shown. Semiconductor package 100 comprises first die 102A (shown in, e.g., FIG. 2), second die 102B and third die 102C. Second die 102B and third die 102C are disposed over underlying first die 102A, and each of second die 102B and third die 102C is respectively bonded to first die 102A in a face-to face configuration. Each of second die 102B and third die 102C are encapsulated in isolation material 120. Each of second die 102B and third die 102C may have one or more through die vias 140B and 140C. Through vias 160B extend through isolation material 120 and provide electrical connections to underlying first die 102A.

Package 100 may include one or more passive devices in isolation material 120. In the embodiment depicted in FIG. 1, package 100 includes inductors 204B and 204C, antenna 202B, coupler 200B, power combiner 210B, and balun 206B. Fewer passive devices or additional passive devices, or different combinations of passive devices or different physical configurations of passive devices, or different kinds of passive devices, may be included according to particular approaches and design requirements. Forming passive devices integrated in package 100 in isolation material 120 as described herein may enable the formation of passive devices using thicker metal. For example, passive devices formed in isolation material 120 may be formed using thicker metal compared to passive devices formed in back end of the line interconnect structures. As such, passive devices formed in isolation material 120, as described herein, may have improved performance. In some embodiments, forming passive devices in isolation material 120 may allow for the formation of passive devices having increased performance without requiring a significant increase in the size of the package 100.

FIG. 1 depicts lines A-A' through F-F'. These lines depict lines along which later cross-sectional views will be depicted in subsequent Figures. FIGS. 2 through 5 and 8-9 are depicted along the line A-A' of FIG. 1.

Figure 2:
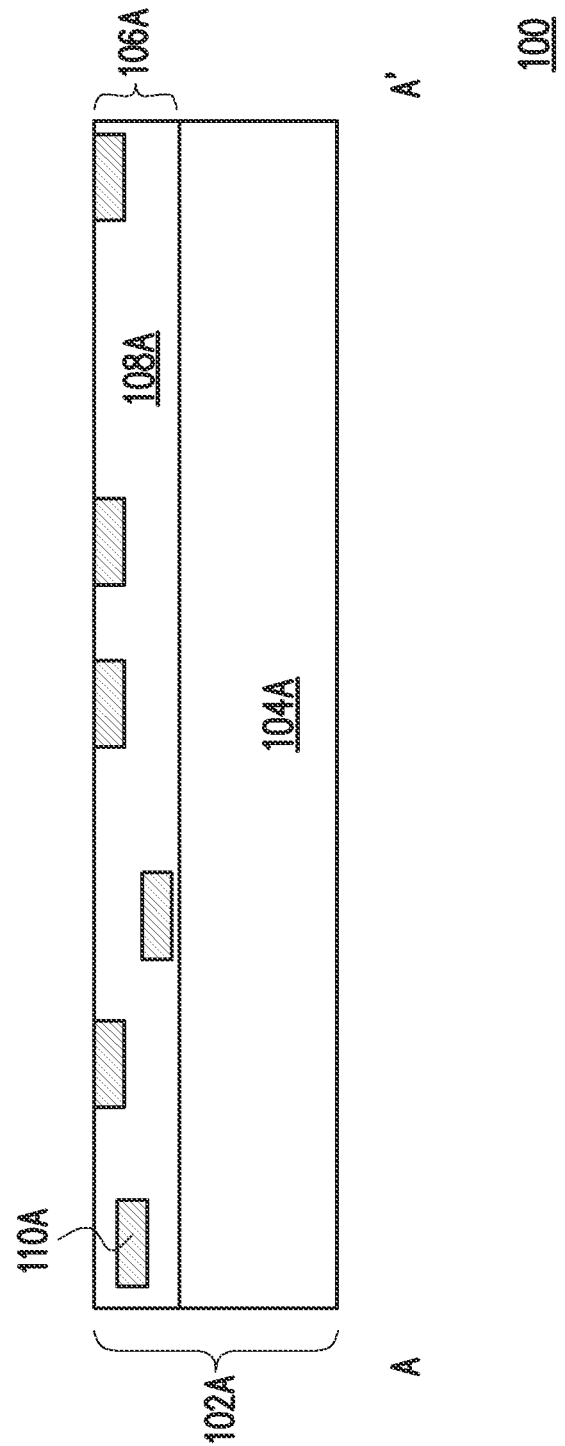
FIGS. 2 through 5 are cross-sectional views of a semiconductor package in accordance with some embodiments.

FIGS. 2 through 5 are cross-sectional views of intermediate steps of manufacturing package 100. Referring to FIG. 2, first die 102A is provided in a wafer form. First die 102A may be a known good die (KGD), for example, which may have passed various electrical and/or structural tests. First die 102A may be a semiconductor die and could be any type of integrated circuit, such as an application processor, logic circuitry, memory, analog circuit, digital circuit, mixed signal, and the like. First die 102A may include a substrate 104A and an interconnect structure 106A over substrate 104A. Substrate 104A may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not illustrated) such as transistors, capacitors, resistors, diodes, photo-diodes, fuses, and the like may be formed at the top surface of substrate 104A. Interconnect structure 106A may be formed over the active devices and a front side of substrate 104A. The term "face" or "front" surface or side is a term used herein implying the major surface of the device upon which active devices and interconnect layers are formed. Likewise, the "back" surface of a die is that major surface opposite to the face or front.

The interconnect structure 106A may include inter-layer dielectric (ILD) and/or inter-metal dielectric (IMD) layers 108A containing conductive features 110A (e.g., conductive lines and vias comprising copper, aluminum, tungsten, combinations thereof, and the like) formed using any suitable method. The ILD and/or IMD layers 108A may include low-k dielectric materials having k values, for example, lower than about 4.0 or even 2.0 disposed between such conductive features. In some embodiments, the ILD and/or IMD layers 108A may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect structure 106A electrically connects various active devices to form functional circuits within first die 102A, and/or connects the various active devices to external devices. The functions provided by such functional circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application.

Additional features, such as input/output (I/O) contacts, passivation layers, conductive pillars, and/or under bump metallurgy (UBM) layers, may also be optionally formed over interconnect structure 106A. The various features of first die 102A may be formed by any suitable method and are not described in further detail herein. Furthermore, the general features and configuration of first die 102A described above are but one example embodiment, and first die 102A may include any combination of any number of the above features as well as other features.

In some embodiments, first die 102A may be placed on a carrier (not shown), which may provide temporary mechanical and structural support for various features (e.g., first die 102A) during subsequent processing steps. In this manner, damage to the package 100 may be reduced or prevented. In other embodiments, first die 102A provides the temporary mechanical and structural support to other components of package 100 during subsequent processing, and no carrier is needed.

Figure 3:
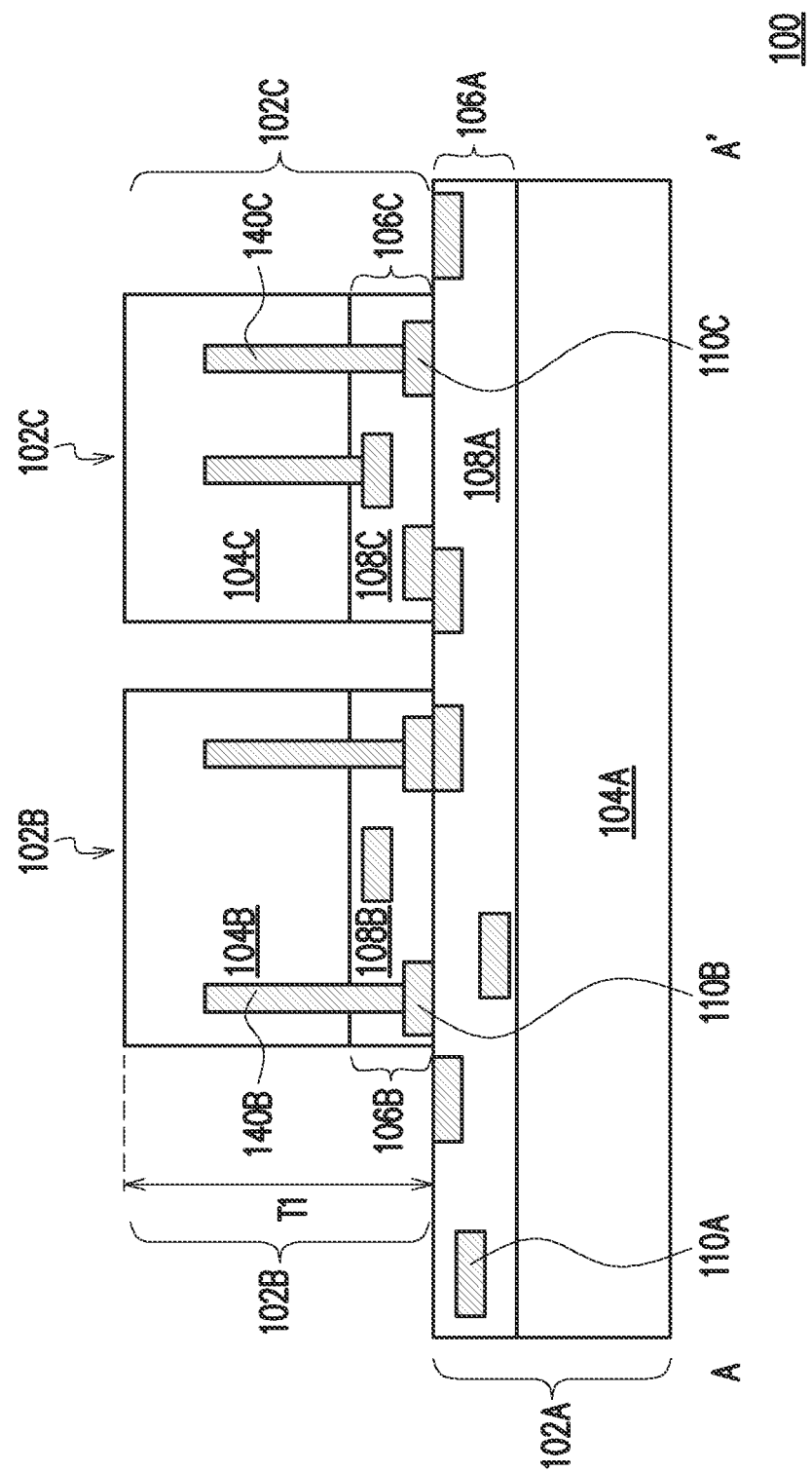

Next, referring to FIG. 3, second die 102B and third die 102C are bonded to first die 102A. Second die 102B and third die 102C may each be bonded to first die 102A in a manner that the face sides (i.e. the sides of the dies containing interconnects 106 B/C) of second die 102B and third die 102C are facing the face side of first die (i.e. the side containing interconnect 106A) 102A, so that the dies are in a face-to-face configuration.

Second die 102B and third die 102C may be similar to first die 102A, and like numerals indicate like components of first die 102A, second die 102B, and third die 102C. For example, second die 102B and third die 102C may be a known good dies (KGDs), for example, which may have passed various electrical and/or structural tests. Second die 102B and third die 102C may be semiconductor dies and could be any type of integrated circuits, such as application processors, logic circuitry, memory, analog circuits, digital circuits, mixed signals, and the like. Second die 102B and third die 102C may be similar types of dies or may be different types of dies. Each of second die 102B and third die 102C may include a substrate 104B/C and an interconnect structure 106B/C over substrate 104B/C. Substrates 104B/C may comprise, for example, bulk silicon, doped or undoped, or an active layer of a semiconductor-on-insulator (SOI) substrate. Alternatively, the substrates 104B/C may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not illustrated) such as transistors, capacitors, resistors, diodes, photo-diodes, fuses, and the like may be formed at the top surfaces of substrates 104B/C. Interconnect structures 106B/C may be formed over the active devices and a front side of substrates 104B/C. The interconnect structures may include inter-layer dielectric (ILD) and/or inter-metal dielectric (IMD) layers 108B/C containing conductive features 110B/C (e.g., conductive lines and vias comprising copper, aluminum, tungsten, combinations thereof, and the like) formed using any suitable method. The ILD and/or IMD layers 108B/C may include low-k dielectric materials having k values, for example, lower than about 4.0 or even 2.0 disposed between such conductive features. In some embodiments, the ILD and/or IMD layers 108B/C may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD).

Interconnect structures 106B/C electrically connect various active devices to form functional circuits within second die 102B and third die 102C, respectively, and may electrically connect the functional circuits in second die 102B and third die 102C to external devices. The functions provided by such circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application. Additional features, such as input/output (I/O) contacts, passivation layers, conductive pillars, and/or under bump metallurgy (UBM) layers, may also be optionally formed over interconnect structures 106B/C.

In some embodiments, second die 102B and third die 102C are bonded to first die 102A using, for example, direct surface bonding, metal-to-metal bonding, hybrid bonding, or another bonding process. In some embodiments, surfaces of first die 102A, second die 102B, and third die 102C that will be bonded undergo a cleaning and/or surface activation process. Next, conductive features 110B of second die 102B and conductive features 110C of third die 102C may respectively be aligned and brought into contact with conductive features 110A of first die 102A, which also brings ILD and/or IMD 108B in second die 102B and ILD and/or IMD 108C in third die 108C into contact with ILD and/or IMD 108A in first die 102A. Second die 102B and third die 102C may respectively be bonded to first die 102A by applying pressure, heat and/or other bonding process steps to the joined surfaces, which may fuse together the aligned conductive features 110A/110B and 110A/110C. The bonding process may also fuse together the surfaces of ILD and/or IMD 108A/108B and 108A/108C that are brought into physical contact during the bonding. In some embodiments, the bonded dies are baked, annealed, pressed, or otherwise treated to strengthen or finalize the bond.

After the bonding, first die 102A may be electrically connected to each of second die 102B and third die 102C. For example, active devices in first die 102A may be connected to active devices in second die 102B and/or third die 102C. In some embodiments, second die 102B may be electrically connected to third die 102C through conductive features in first die 102A. For example, active devices in second die 102B may be electrically connected to active devices in third die 102C through conductive features in first die 102A.

Second die 102B and third die 102C may have initial thicknesses T1 of about 80 µm to about 200 µm, such as about 100 µm. Second die 102B and third die 102C may also comprise through die vias 140B and 140C which respectively extend from interconnect structures 106 B/C at least part of the way through substrates 104B and 104C. Through die vias 140B and 140C are formed to provide electrical connections between interconnect structures 106 B/C and a far side of substrates 104B/C, and/or between interconnect structure 106A and the far side of substrates 104B/C. As will be explained in detail below (see FIG. 5), in subsequent processing second die 102B and third die 102C will be thinned so that through die vias 140B/C will be exposed on back sides of second die 102B and third die 102C, allowing for backside electrical connections to be made to through die vias 104B/C.

Figure 4:
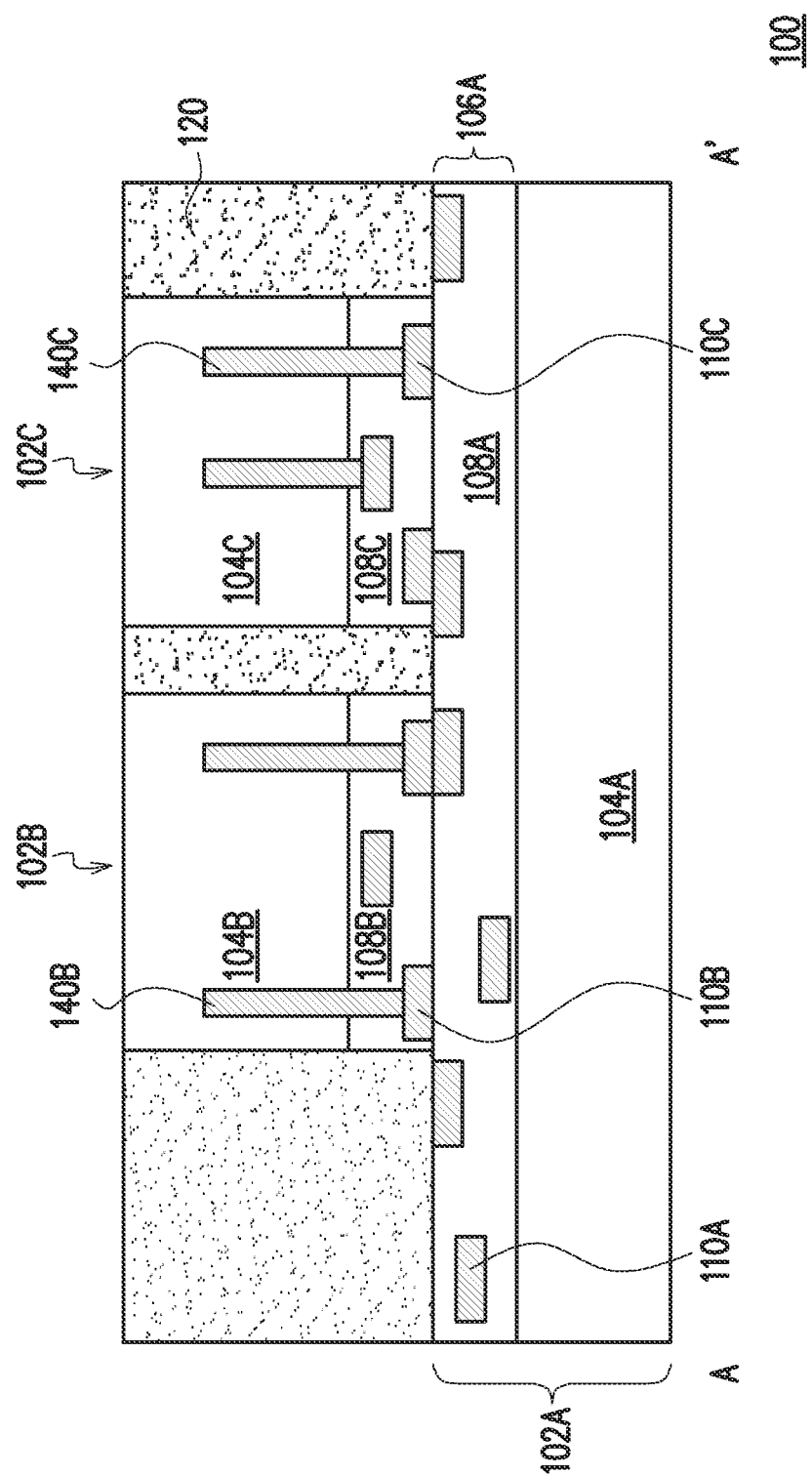

Referring to FIG. 4, isolation material 120 is formed around second die 102B and third die 102C. Isolation material 120 extends along sidewalls of second die 102B and third die 102C, and along a top surface of first die 102A. In a top down view (not shown), isolation material 120 may encircle both second die 102B and third die 102C. Isolation material 120 may comprise a dielectric material (e.g., an oxide, a nitride, or the like), a polymer, a molding compound, or the like, a material composition of which may be selected based on the final intended thickness T2 of second die 102B and third die 102C (See FIG. 5).

Figure 5:
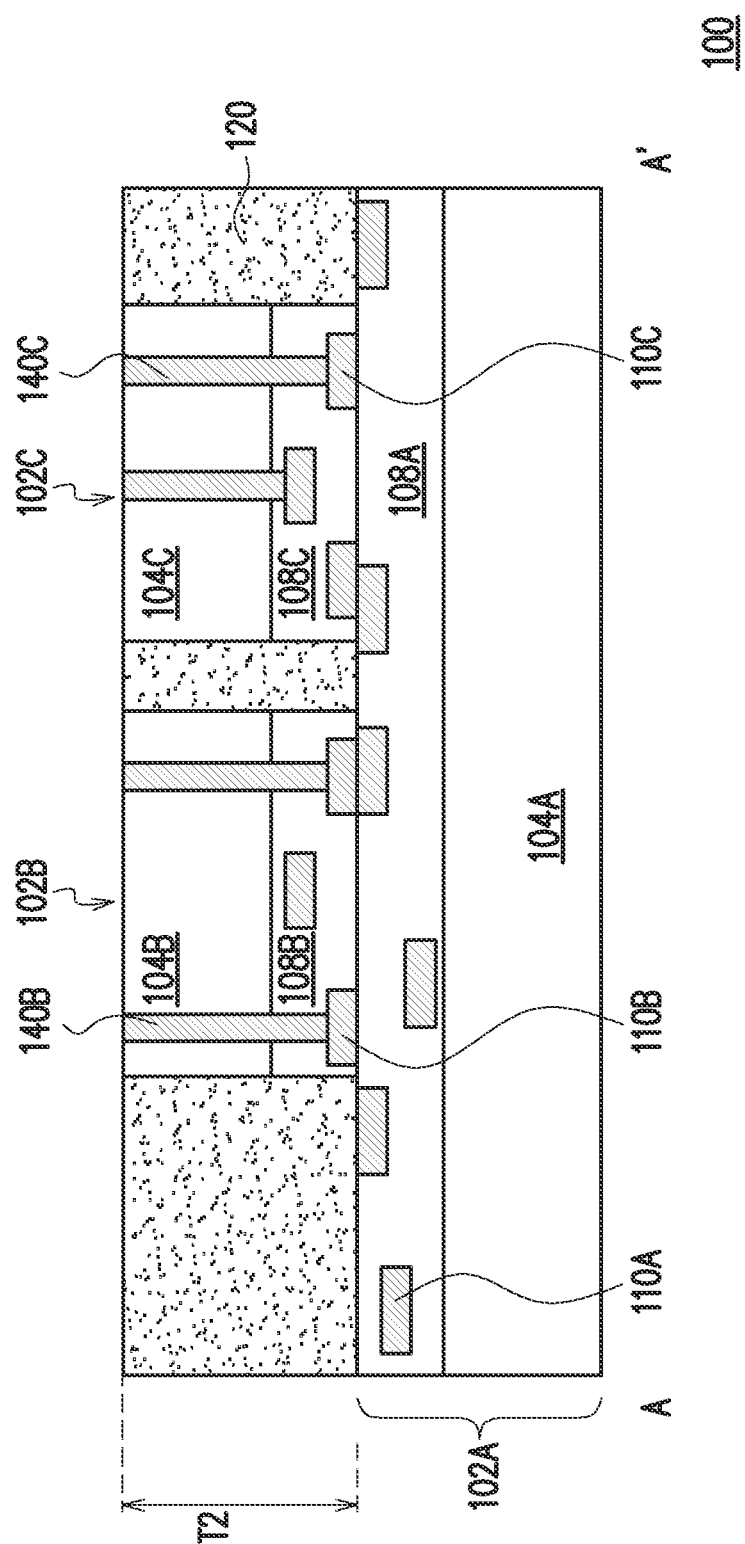

In some embodiments, isolation material 120 may be selected according to a final thickness T2 of second die 102B and third die 102C (See FIG. 5). For example, a dielectric material may be used for isolation material 120 when second die 102B and third die 102C are relatively thinner. As another example, a polymer material or even a molding compound may be used for a relatively thicker second die 102B and third die 102C in order to provide improved structural support.

Referring to FIG. 5, after isolation material 120 is formed, a planarization process (e.g., CMP, etch back, grinding, or the like) may be applied. The grinding process may thin the thicknesses of second die 102B and third die 102C and expose through die vias 140B and 140C. A thickness T2 of second die 102B and third die 102C after the planarization process may be about 10 µm to about 50 µm, such as 20 µm. After the planarization process, top surfaces of isolation material 120, second die 102B, and third die 102C may be substantially planar.

In some embodiments, the planarization process may create metal residues, such as metal particles, which are left on the top surfaces. Accordingly, after the grinding, a cleaning may be performed, for example, through a wet etching, so that the metal residue is removed.

Next, as shown in FIGS. 6A through 6F, isolation material 120 is patterned to create openings in which through vias and/or passive devices will be formed. In some embodiments, openings may be formed in isolation material 120 using a combination of photolithography and/or etching.

Figure 6A:
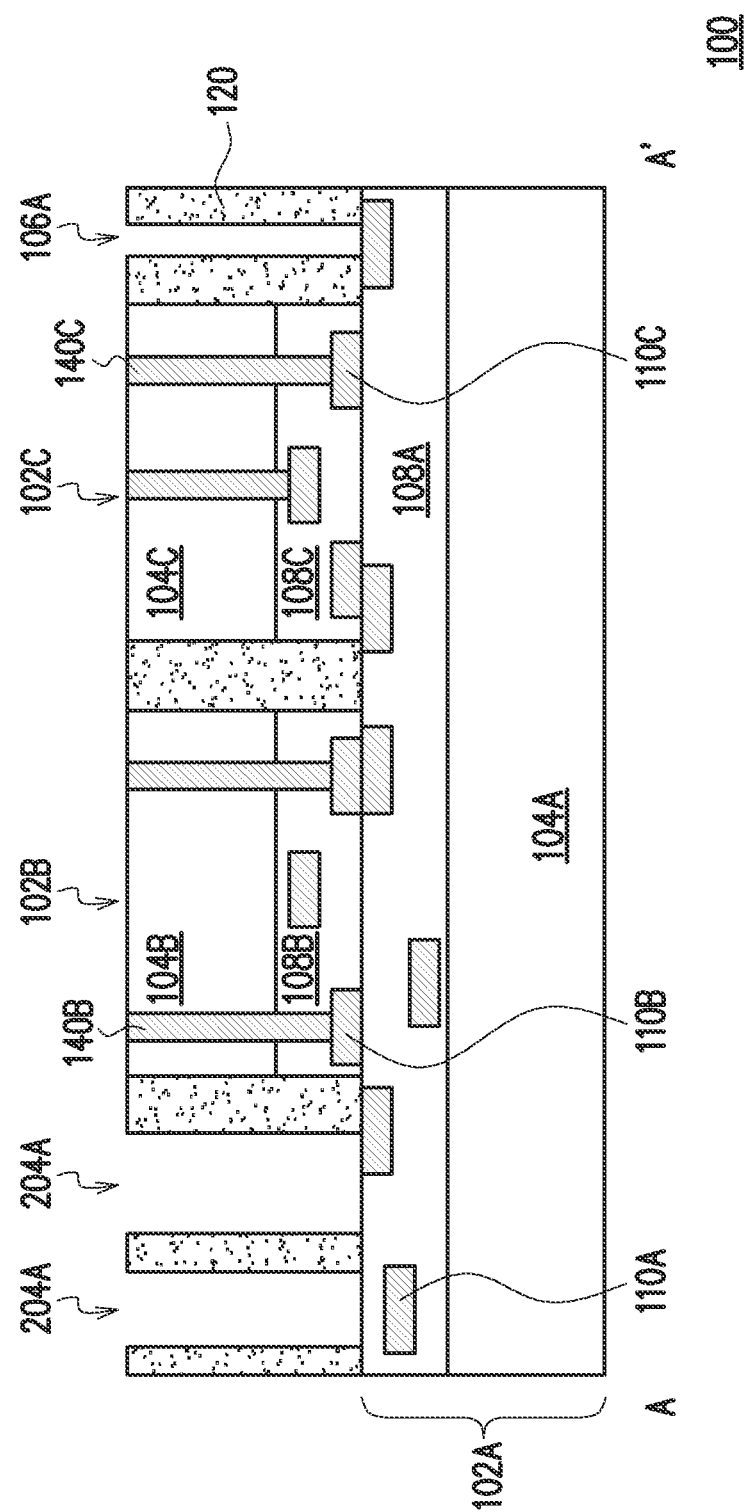

FIG. 6A depicts package 100 along the line A-A' depicted in the plan view of FIG. 1. Along the line A-A' isolation material 120 is patterned to create an opening 160A in which a through via 160B will be formed (see FIG. 7A). Isolation material 120 is also patterned to create opening 204A in which inductor 204B will be formed (see FIG. 7A). Although opening 204A appears as two different openings in the cross-section depicted in FIG. 6A, in a plan view openings 204A may be a single continuous opening. Opening 160A, in which a through via 160B will be formed, may expose one or more conductive features 110A in first die 102A to which the through vias 160B will be electrically connected. Opening 204A may also expose one or more conductive features 110A in first die 102A to which inductor 204B will be electrically connected. Openings 160A and 204A may be formed simultaneously, or may formed in successive etching and/or photolithography processes.

Figure 6B:
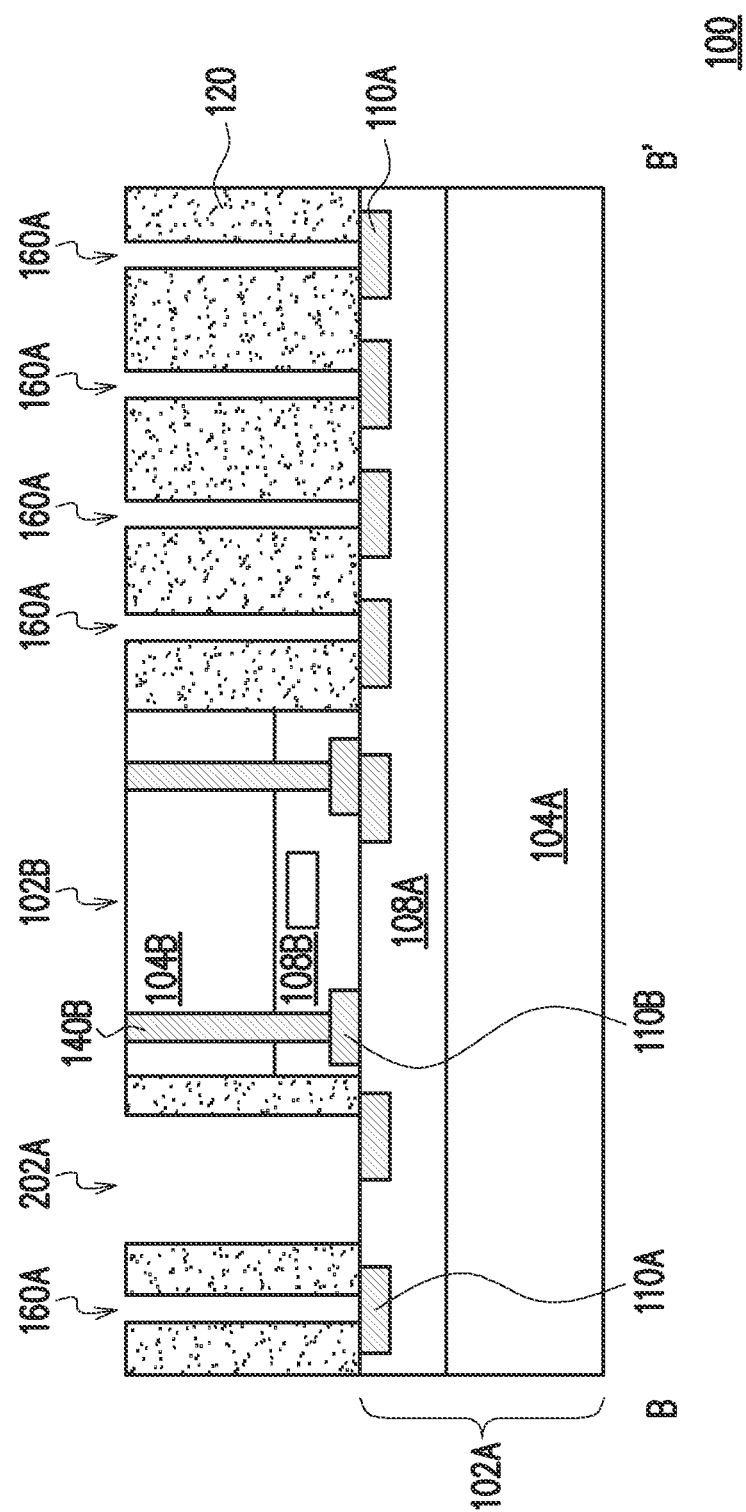

FIG. 6B depicts package 100 along the line B-B' depicted in the plan view of FIG. 1. Along the line B-B' isolation material 120 is patterned to create a plurality of openings 160A in which through vias will be formed (see FIG. 7B). Isolation material 120 is also patterned to create an opening 202A in which a portion of antenna 202B will be formed (See FIG. 7B). Openings 160A, in which through vias 160B will be formed, may expose one or more conductive features 110A in first die 102A to which the through vias 160B will be electrically connected. Opening 202A may also expose one or more conductive features 110A in first die 102A to which antenna 202B will be electrically connected. Openings 160A and 202A may be formed simultaneously, or may formed in successive etching and/or photolithography processes.

Figure 6C:
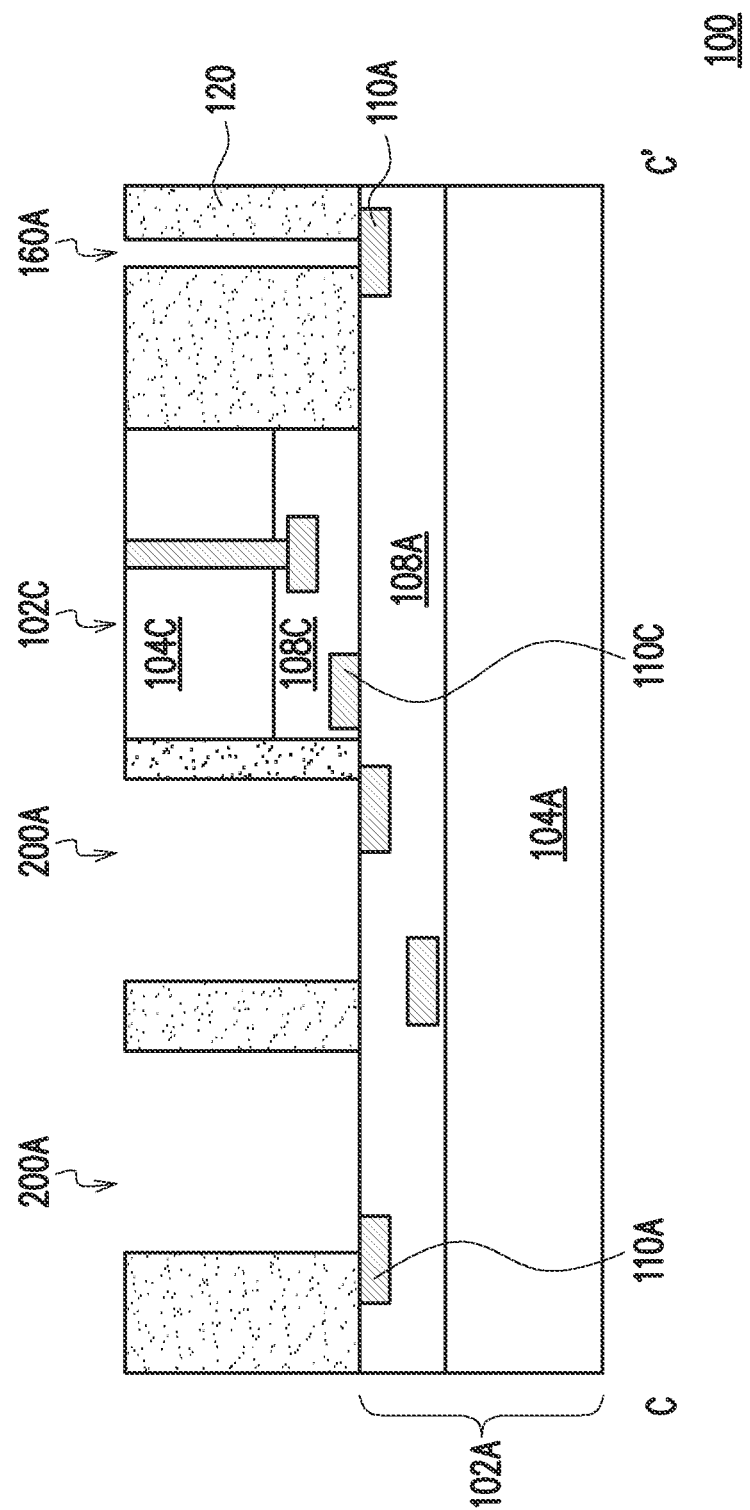

FIG. 6C depicts package 100 along the line C-C' of the plan view of FIG. 1. Along the line C-C' isolation material 120 is patterned to create an opening 160A in which a through via will be formed (see FIG. 7C). Isolation material 120 is also patterned to create an opening 200A in which coupler 200B will be formed (See FIG. 7C). Although opening 200A appears as two different openings in the cross-section depicted in FIG. 6C, in a plan view opening 200A may be a single continuous opening. Opening 160A, in which a through via 106B will be formed, may expose a conductive feature 110A in first die 102A. Opening 200A may also expose one or more conductive features 110A in first die 102A to which coupler 200B will be electrically connected. Openings 160A and 200A may be formed simultaneously, or may formed in successive etching and/or photolithography processes.

FIG. 6D depicts package 100 along the line D-D' of the plan view of FIG. 1. Along the line D-D' isolation material 120 is patterned to create a plurality of openings 160A in which a plurality of through vias will be formed (see FIG. 7D). Isolation material 120 is also patterned to create opening 210A in which power combiner 210B will be formed (See FIG. 7D). Although opening 210A appears as two different openings in the cross-section depicted in FIG. 6D, in a plan view opening 210A may be a single continuous opening. Openings 160A, in which a plurality of through vias 106B will be formed, may each expose one or more conductive features 110A in first die 102A to which the through vias will be electrically connected. Opening 210A may expose one or more conductive feature 110A in first die 102A to which power combiner 210B will be electrically connected. Openings 160A and 210A may be formed simultaneously, or may formed in successive etching and/or photolithography processes.

Figure 6E:
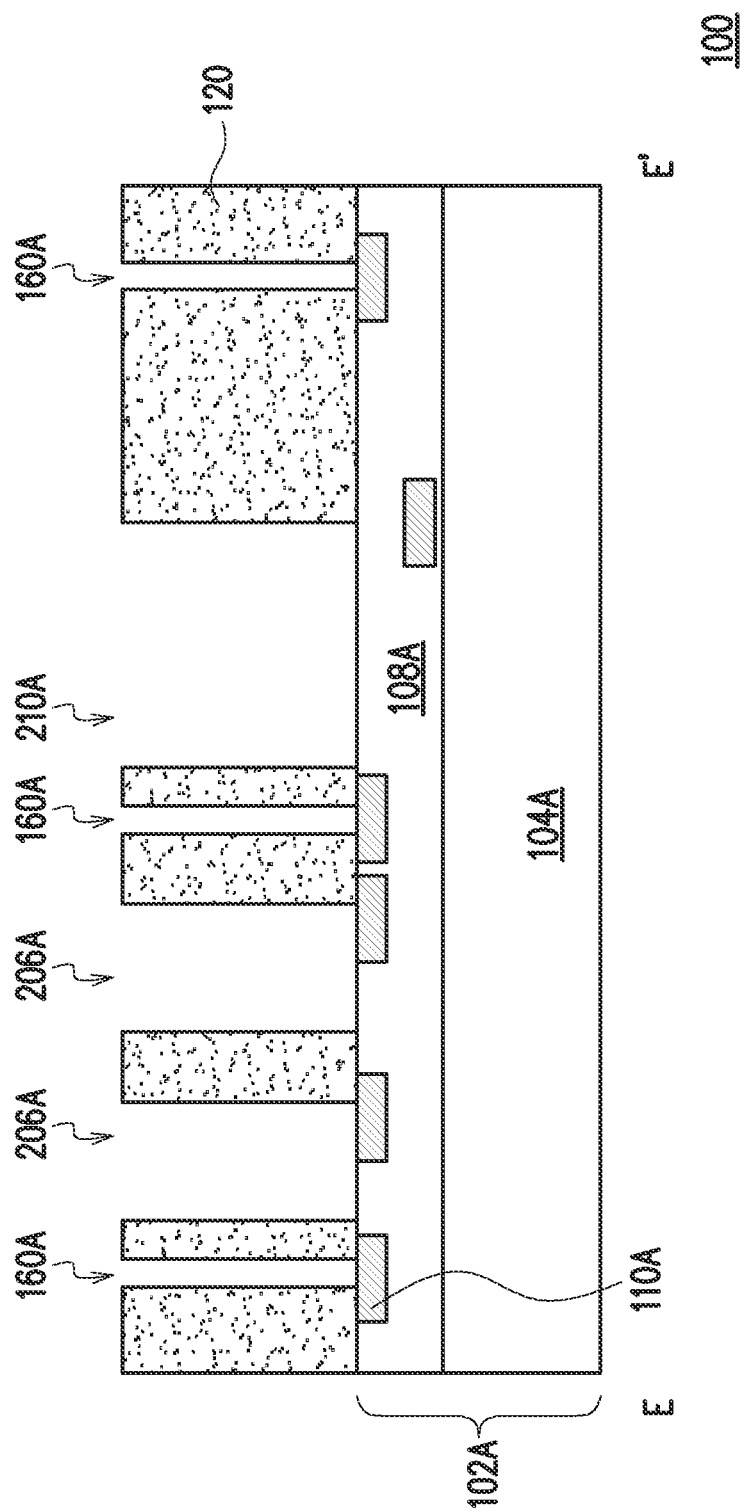
Figure 6F:
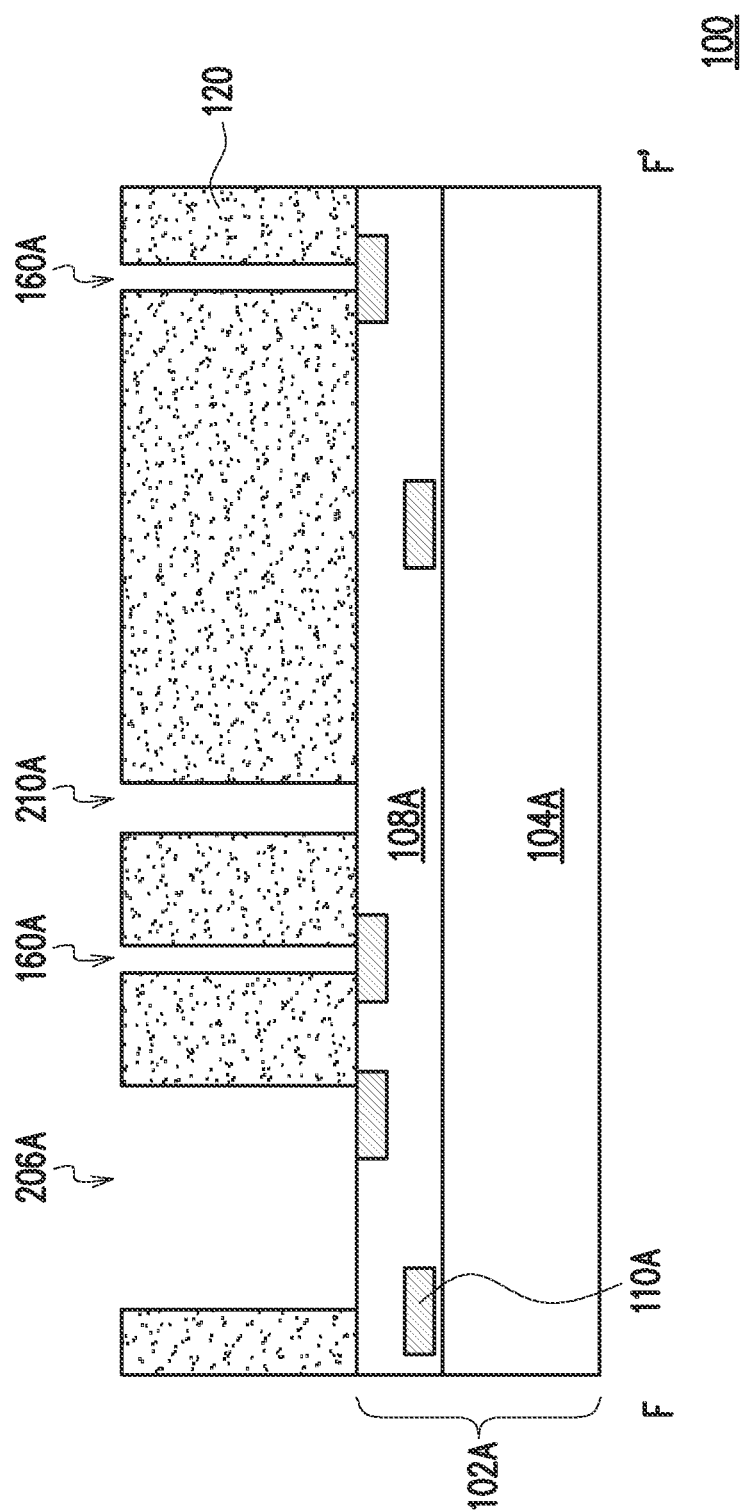

FIGS. 6E and 6F depict package 100 along the lines E-E' (FIG. 6E) and F-F' (FIG. 6F) of the plan view of FIG. 1. Along the lines E-E' and F-F' isolation material 120 is patterned to create a plurality of openings 160A in which a plurality of through vias will be formed (see FIGS. 7E and 7F). Isolation material 120 is also patterned to create openings 210A in which power combiner 210B, discussed above, will be formed, and to create openings 206A in which balun 206B will be formed. Openings 160A, in which a plurality of through vias 106B will be formed, may each expose one or more conductive features 110A in first die 102A to which the through vias 160B will be electrically connected. Openings 206A may expose conductive feature 110A in first die 102A to which balun 206B will be electrically connected. Openings 160A, 210A and 206A may be formed simultaneously, or may formed in successive etching and/or photolithography processes.

Figure 7A:
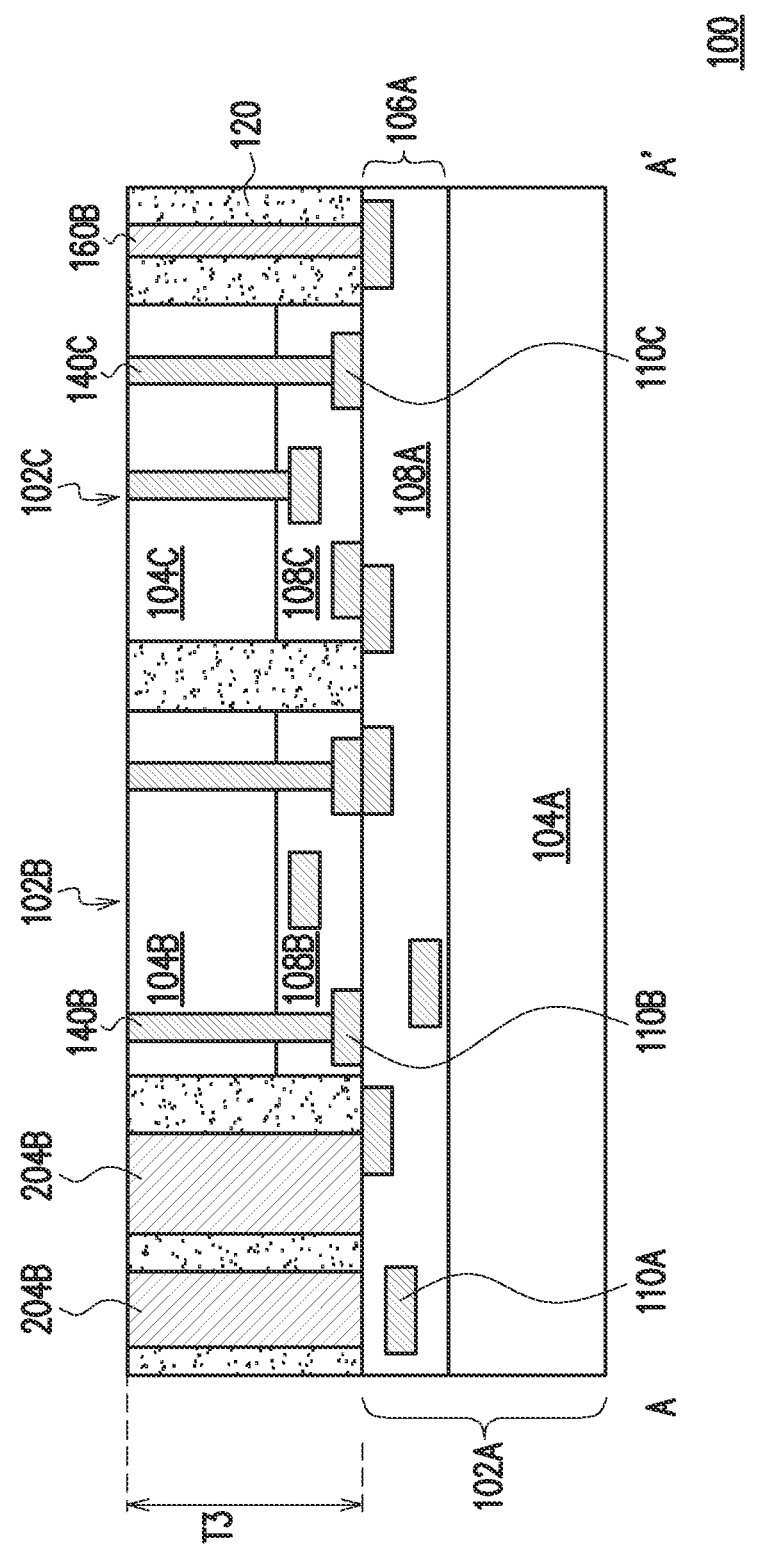
FIGS. 7A through 7F are cross-sectional views of a semiconductor package in accordance with some embodiments.
Figure 7B:
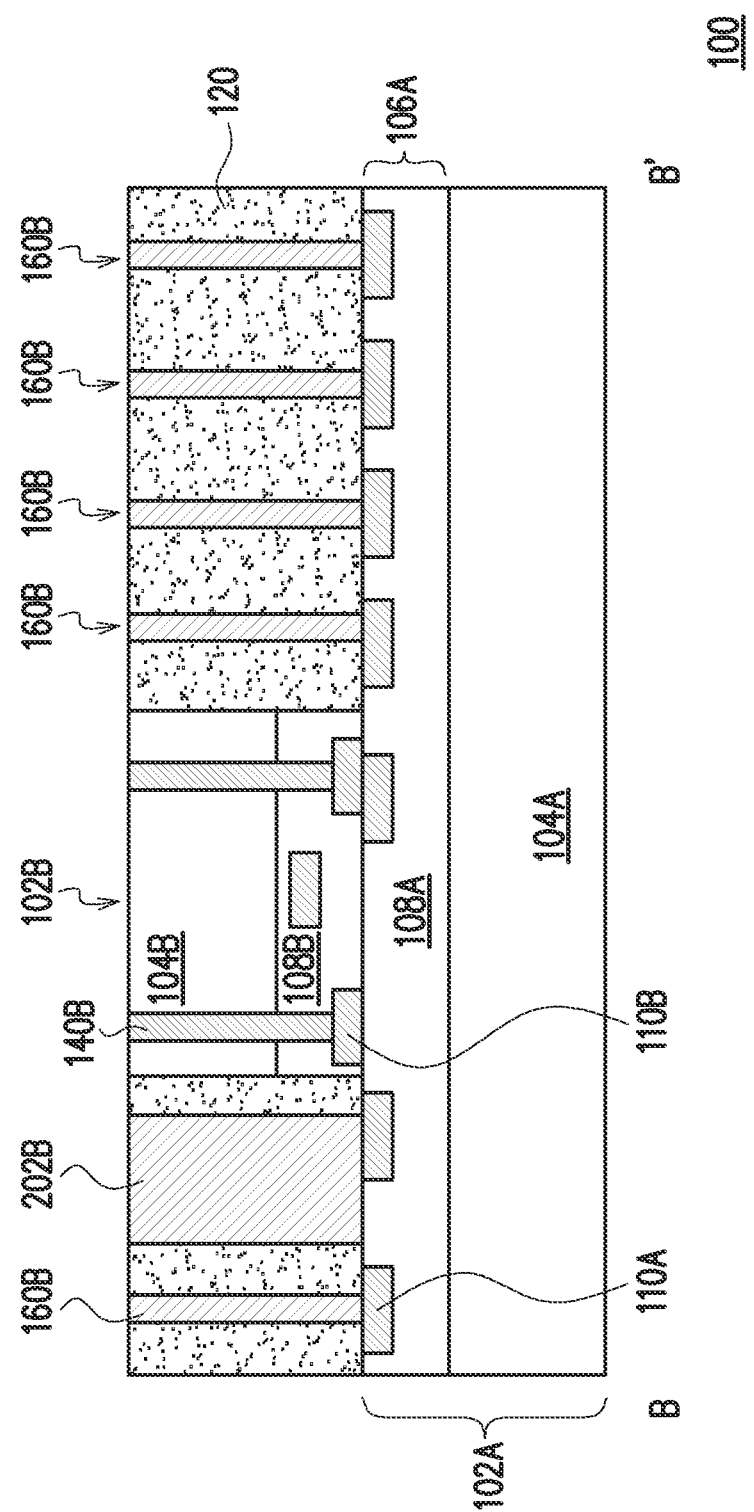
Figure 7C:
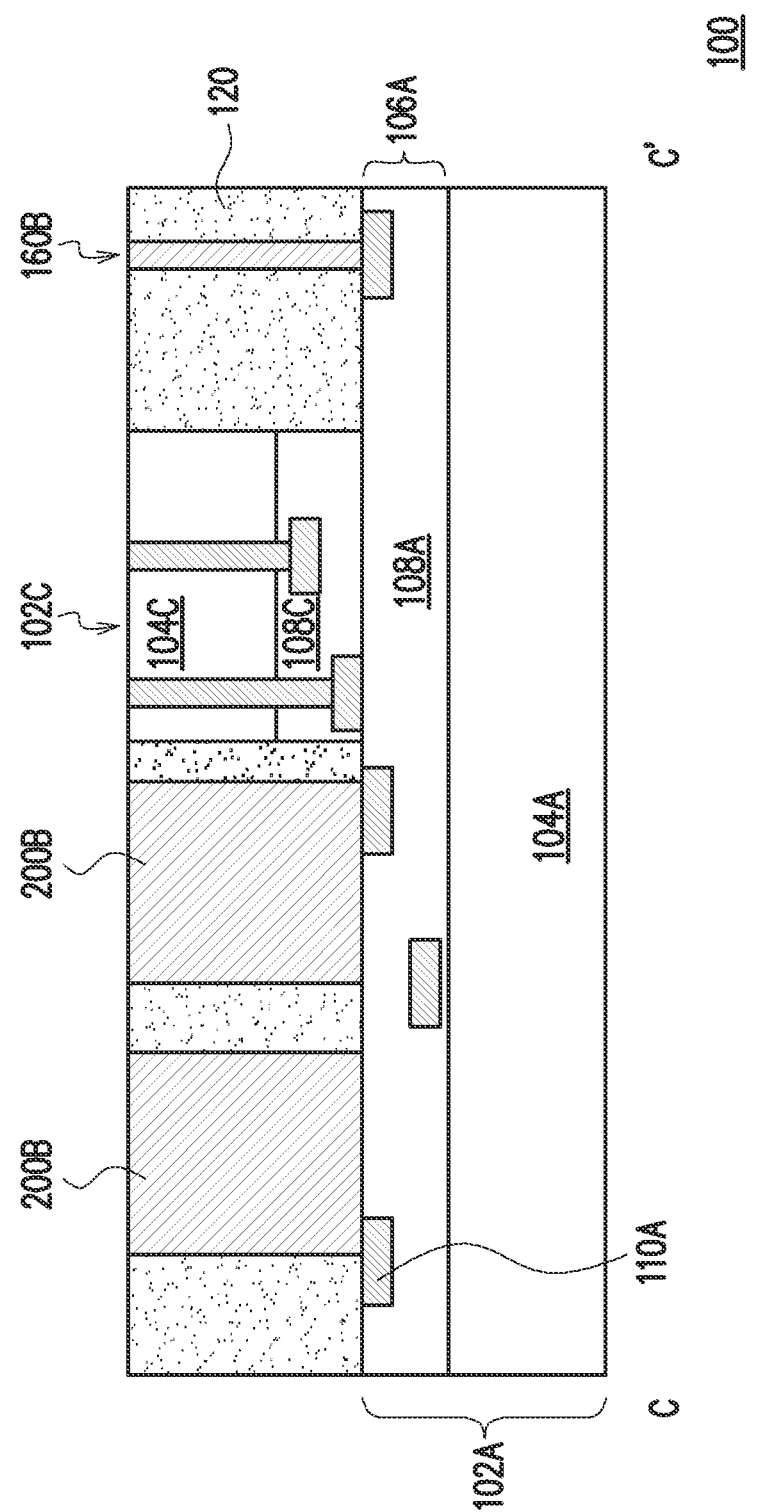
Figure 7D:
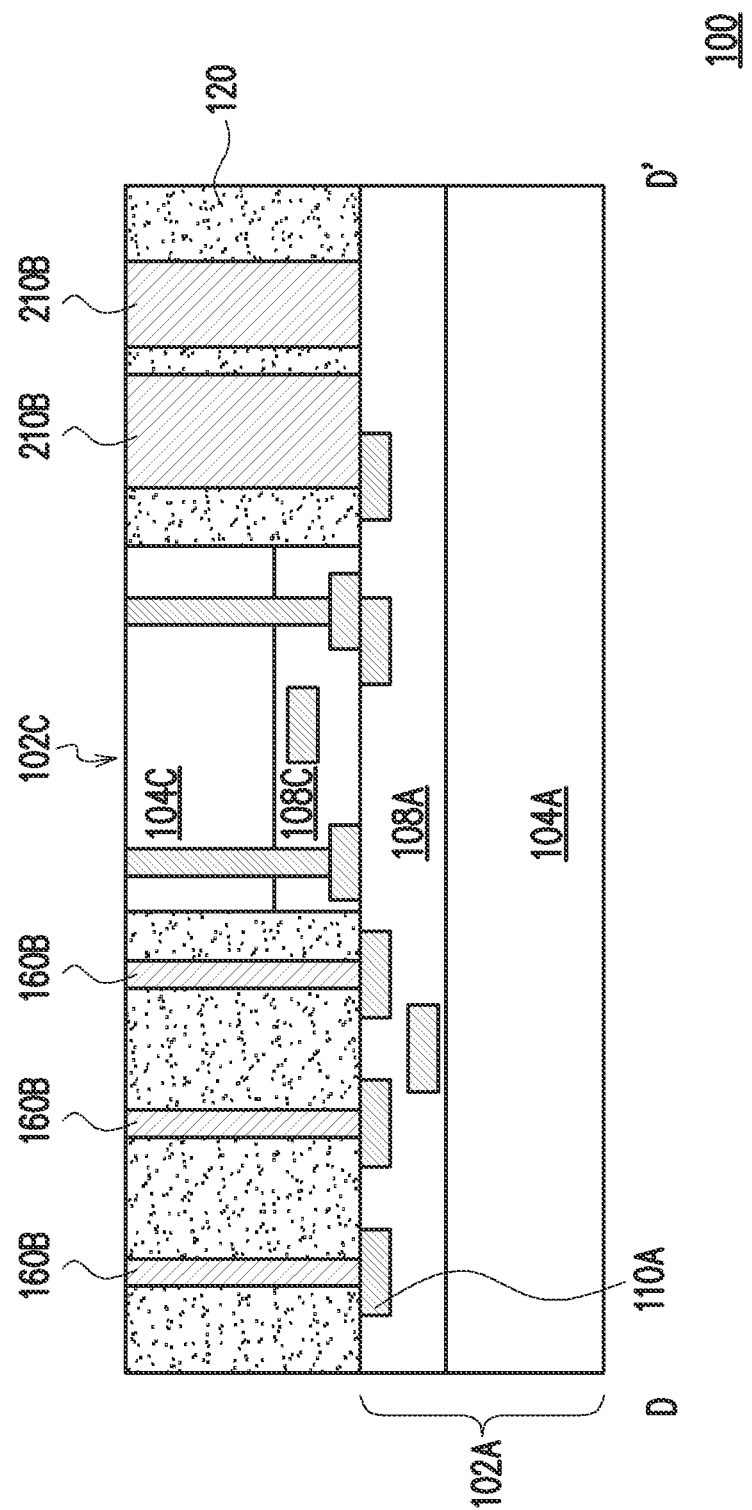
Figure 7E:
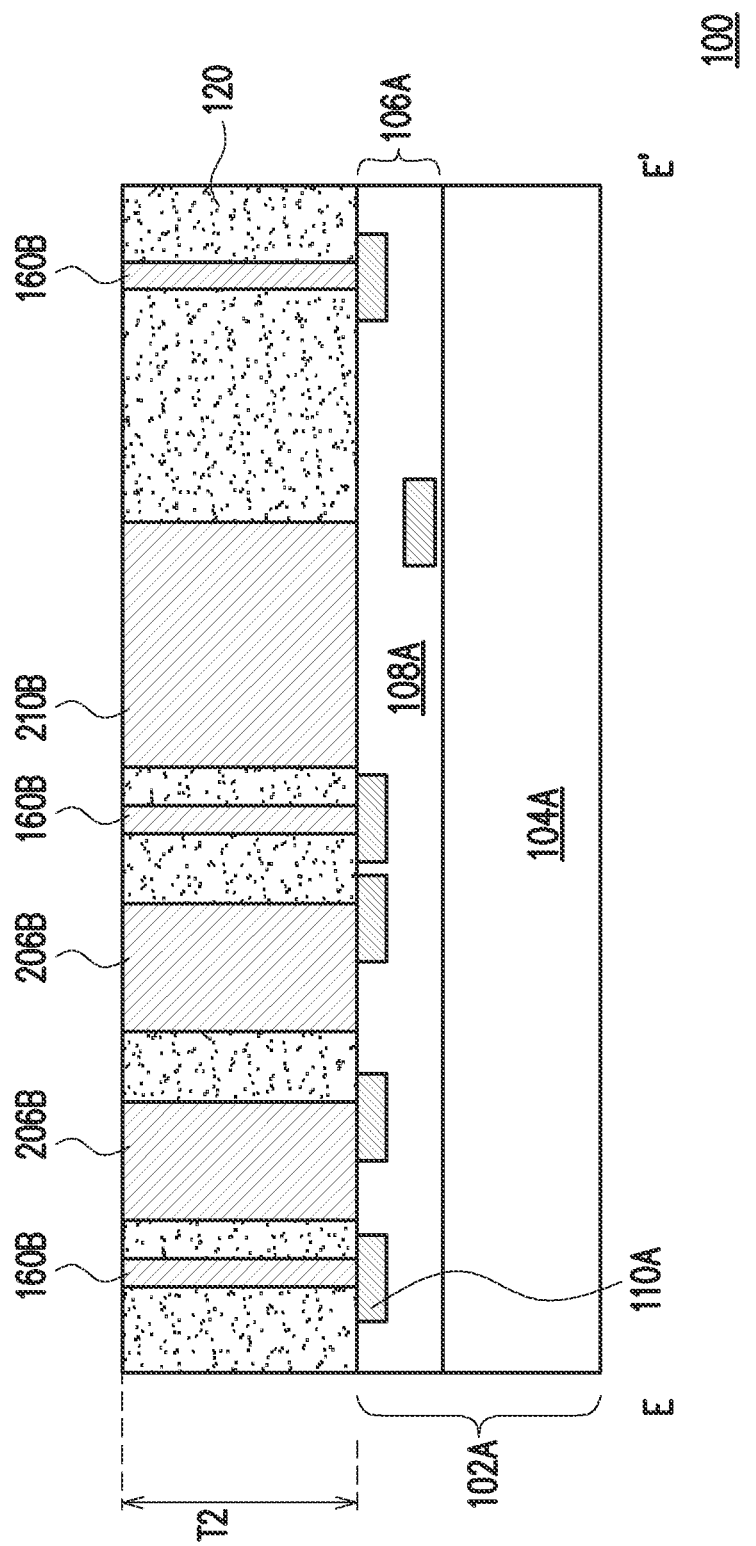
Figure 7F:
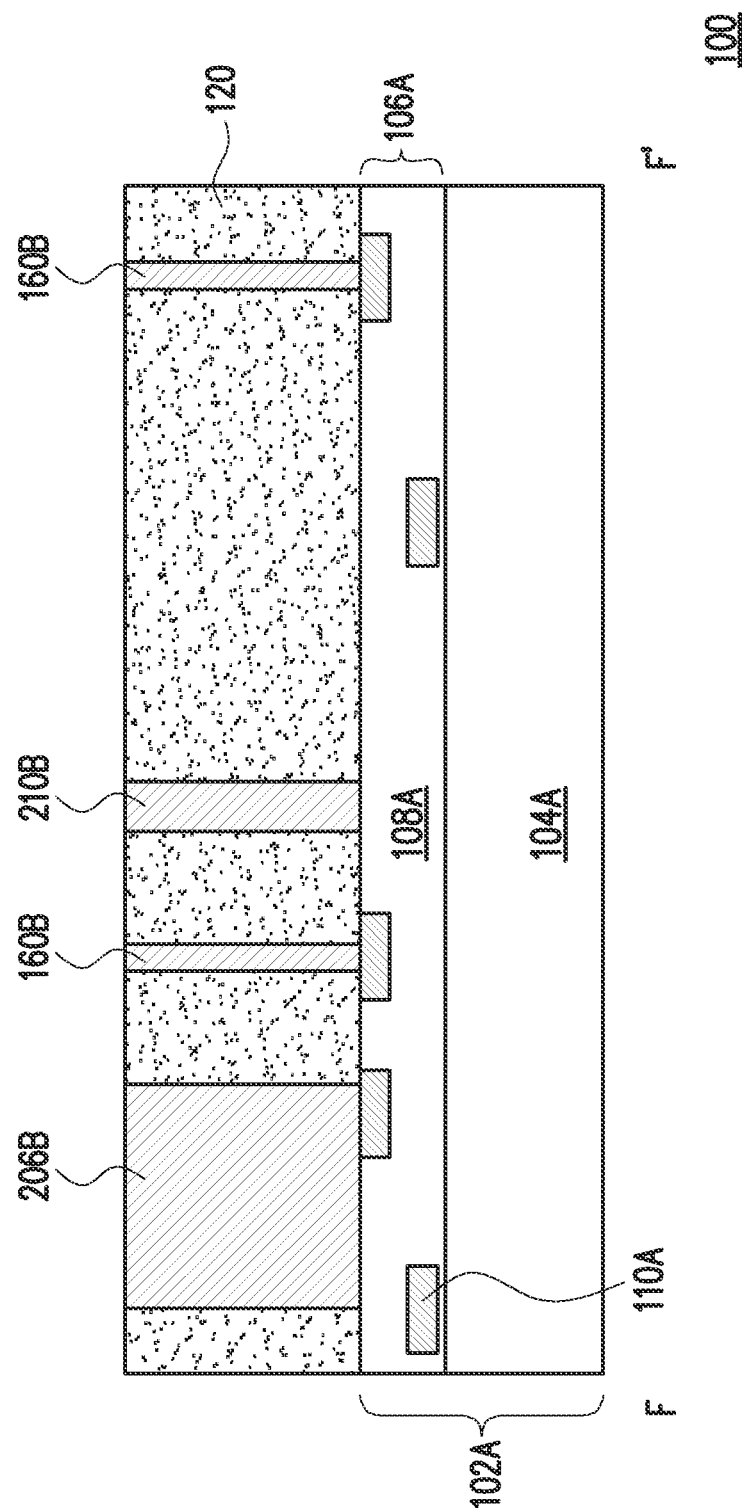

After isolation material 120 is patterned, a conductive material may be deposited in the openings (e.g., using electroless plating, electrochemical plating, or the like). In some embodiments, the conductive material may overfill the openings, and a planarization process (e.g., CMP) may be applied to remove excess conductive material and form through vias and passive devices. The resulting structure is depicted in FIGS. 7A through 7F. For example, FIG. 7A depicts line A-A' of FIG. 1 after through vias 160B and an inductor 204B have been formed in isolation material 120. Inductor 204B and through via 160B are electrically connected to interconnect structure 106A using conductive features 110A. FIG. 7B depicts line B-B' of FIG. 1 after through vias 160B and an antenna 202B have been formed in isolation material 120. Antenna 202B and through vias 160B are electrically connected to interconnect structure 106A using conductive features 110A. FIG. 7C depicts line C-C' of FIG. 1 after through vias 160B and coupler 200B have been formed in isolation material 120. Coupler 200B and through via 160B are electrically connected to interconnect structure 106A using conductive features 110A. FIG. 7D depicts line D-D' of FIG. 1 after through vias 160B and power combiner 210B have been formed in isolation material 120. Power combiner 210B and through vias 160B are electrically connected to interconnect structure 106A using conductive features 110A. FIGS. 7E and 7F depict lines E-E' and F-F' of FIG. 1 after through vias 160B and balun 206B have been formed in isolation material 120. Balun 206B and through vias 160B are electrically connected to interconnect structure 106A using conductive features 110A. A thickness T3 of each passive device may be about 10 μm to about 50 μm, such as 20 μm. The thickness of each passive device may be substantially the same as a thickness of the through vias 160B and a thickness of second die 102B and third die 102C.

FIGS. 3 through 7F depict embodiments in which an isolation material 120 is formed, openings are etched in isolation material 120, and then passive devices (antenna 202B, inductor 204B, balun 206B, coupler 208B, and/or power combiner 210B) through vias 160B are formed in the openings. In other embodiments, the passive devices (antenna 202B, inductor 204B, balun 206B, coupler 208B, and/or power combiner 210B) and through vias 160B may be formed before second die 102A and third die 102C are bonded to first die 102A and isolation material 120 is formed. For example, a conductive seed layer (not shown) may be deposited over first die 102A, e.g. as shown in FIG. 2, on a surface of ILD and/or IMD 108A on which passive devices (antenna 202B, inductor 204B, balun 206B, coupler 208B, and/or power combiner 210B) and/or through vias 160B will be formed. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like. In some embodiments, the seed layer comprises titanium layer and a copper layer over the titanium layer. In alternative embodiments, the seed layer is a copper layer.

Next, a mask layer, such as a patterned photoresist layer (not shown), may be deposited and patterned, wherein openings in the mask layer expose the seed layer. The openings in the mask layer may be filled with a conductive material using, for example, an electroless plating process or an electrochemical plating process, thereby creating passive devices (antenna 202B, inductor 204B, balun 206B, coupler 208B, and/or power combiner 210B) and through vias 160B. The plating process may uni-directionally fill openings (e.g., from the seed layer upwards) in the patterned photoresist layer. Uni-directional filling may allow for more uniform filling of such openings. Alternatively, another seed layer may be formed on sidewalls of the openings in the patterned photoresist layer, and such openings may be filled multi-directionally. Next, the mask layer may be removed, for example in an ashing and/or wet strip process, and an etch step is performed to remove the exposed portions of the seed layer, wherein the etching may be an anisotropic etching. The portions of the seed layer that are overlapped by a passive device (antenna 202B, inductor 204B, balun 206B, coupler 208B, and/or power combiner 210B) or a through via 160B, on the other hand, remain not etched. Next, second die 102A and third die 102C are bonded to first die 102A, using the same or similar methods described above in connection with FIG. 3. Next, isolation material 120 is formed along sidewalls of the passive devices (antenna 202B, inductor 204B, balun 206B, coupler 208B, and power combiner 210B) and through vias 160B using the same or similar processes described above in connection with FIG. 4. In some embodiments, after the isolation material 120 is formed excess isolation material 120 will be present on a top surface of the package 100. A grinding process may be performed to planarize the top surfaces of isolation material 120 and to expose the passive devices (antenna 202B, inductor 204B, balun 206B, coupler 208B, and power combiner 210B) and through vias 160B through the isolation material. The resulting structure is the same as or similar to the structure depicted in FIGS. 7A-F.

Figure 8:
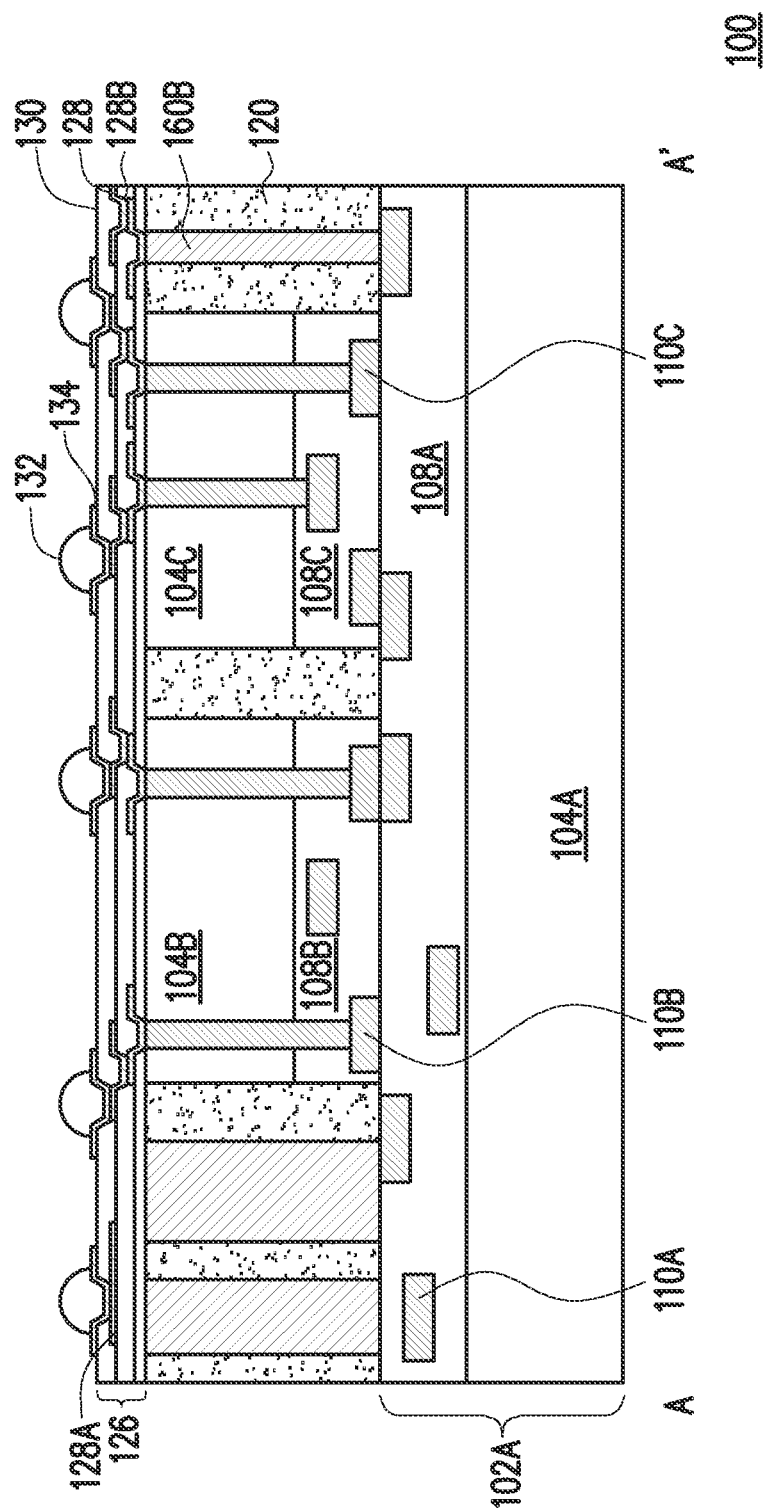
FIGS. 8 and 9 are cross-sectional views of a semiconductor package in accordance with some embodiments.

In FIG. 8, fan-out redistribution layers (RDLs) 126 may be formed over isolation material 120, second die 102B and third die 102C. Generally, RDLs 126 provide a conductive pattern that allows a pin-out contact pattern for a completed package different than the pattern of through vias 106B and/or through die vias 140B/C, allowing for greater flexibility in the placement of through vias 160B, second die 102B and third die 102C. The RDLs 126 may be utilized to provide an external electrical connection to first die 102A, second die 102B and/or third die 102C and/or to through vias 160B. The RDLs 126 may further be used to electrically couple first die 102A, second die 102B and/or third die 102C to through vias 160B, which may be electrically coupled to one or more other packages, package substrates, components, the like, or a combination thereof. The RDLs 126 comprise conductive features 128 which include conductive lines 128A and vias 128B, wherein vias 128B connect an overlying line (e.g., an overlying conductive lines 128A) to an underlying conductive feature (e.g., through vias 160B, through die vias 140B/C, and/or conductive lines 128A). Conductive lines 128A may extend along any direction. RDLs 126 may extend laterally past edges of first die 102A over a top surface of isolation material 120. Conductive features 128 may be formed in one or more polymer layers 130. Polymer layers 130 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 128 (e.g., conductive lines 128A and/or vias 128B) may be formed in polymer layers 130 and electrically connect to second die 102B and third die 102C as well as interconnect structure 106A of first die 102A (e.g., using through vias 160B). The formation of conductive features 128 may include patterning polymer layers 130 (e.g., using a combination of photolithography and/or etching processes) and forming conductive features over and in the patterned polymer layer. For example, conductive features 128 may further include depositing a seed layer (not shown), using a mask layer (not shown) having various openings to define the shape of conductive features 128, and filling the openings in the mask layer using an electrochemical plating process, for example. The mask layer and excess portions of the seed layer may then be removed. Another polymer layer may be formed over the conductive features that have been formed, for example to electrically isolate the conductive feature and to provide a more planar surface for subsequent processing. The number of polymer layers and conductive features of RDLs 126 is not limited to the illustrated embodiment of FIG. 8. For example, RDLs 126 may include any number of stacked, electrically connected conductive features in multiple polymer layers.

As further illustrated by FIG. 8, additional I/O features are formed over RDLs 126. For example, external connectors 132 (e.g., BGA balls, C4 bumps, and the like) may be formed over RDLs 126. Connectors 132 may be disposed on UBMs 134, which may also be formed over RDLs 126. Connectors 132 may be electrically connected to first die 102A, second die 102B, and third die 102C by RDLs 126. Connectors 132 may be used to electrically connect package 100 to other package components such as another device die, interposers, package substrates, printed circuit boards, a mother board, and the like.

There are many possible different electrical connections that may be formed in package 100 according to a particular design or approach. For example, a connector 132 may be electrically connected to a passive device (such as antenna 202B, inductor 204B, balun 206B, coupler 208B, and/or power combiner 210B), and the passive device may in turn be electrically connected to second die 102B and/or third die 102C. A connector 132 may be electrically connected to a passive device (such as antenna 202B, inductor 204B, balun 206B, coupler 208B, and/or power combiner 210B), and the passive device may in turn be electrically connected to first die 102A. A connector 132 may be electrically connected to first die 102A, and first die 102A may in turn be electrically connected to a passive device, such as antenna 202B, inductor 204B, balun 206B, coupler 208B, and/or power combiner 210B. A connector 132 may be electrically connected to second die 102B or third die 102C, which may in turn be electrically connected to first die 102A, and first die 102A may in turn be electrically connected to a passive device, such as antenna 202B, inductor 204B, balun 206B, coupler 208B, and/or power combiner 210B. As a final example, a connector 132 may be electrically connected to a through via in second die 102B or a through via in third die 102C, which may in turn be electrically connected to first die 102A, which may in turn be electrically connected to a passive device, such as antenna 202B, inductor 204B, balun 206B, coupler 208B, and/or power combiner 210B.

Figure 9:
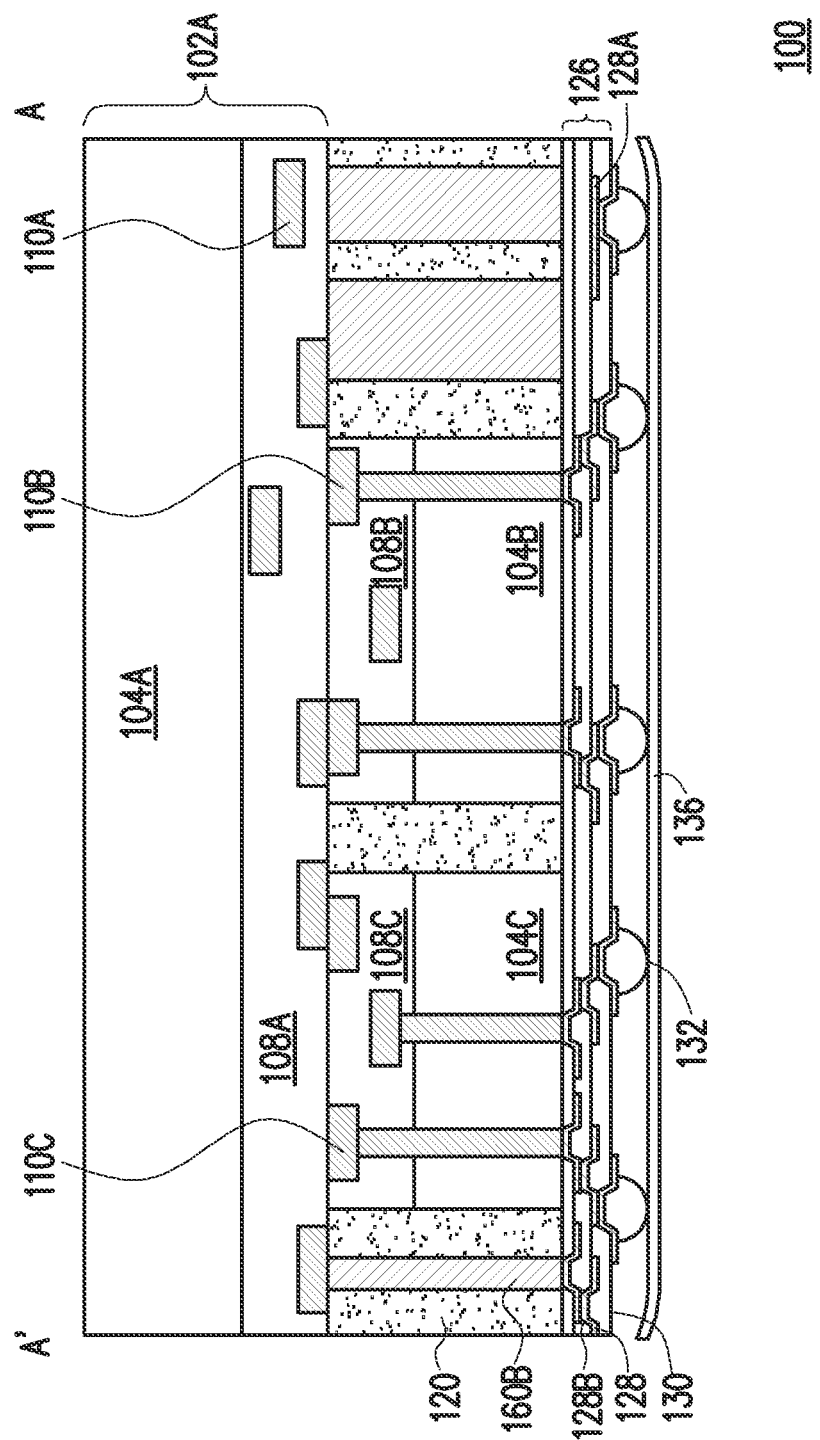

Next, as illustrated in FIG. 9, an orientation of package 100 may be reversed. In the reversed orientation, connectors 132 may be attached to a temporary support frame 136 (e.g., comprising a support tape).

As described herein, a semiconductor package may for formed wherein functional chips are directly bonded to other functional chips, and through vias may extend through isolation material encapsulating one or more of the functional chips. Passive devices may be integrated in the package and formed in the same isolation material in which the through vias and/or functional chips are formed. Passive devices may be formed using thicker metal than if the passive devices were formed in a back end of the line interconnect structure. Passive devices formed in the same isolation material as through vias and/or functional chips, as described herein, may have improved performance without requiring a significant increase in the size of the package 100.

A method is provided in accordance with some embodiments. The method includes bonding a second die to a surface of a first die. The method also includes encapsulating the second die in an isolation material. The method also includes forming a through via extending through the isolation material. The method also includes forming a first passive device in the isolation material.

A method is provided in accordance with some embodiments. The method includes aligning contacts of a second die to first contacts of a first die, and aligning contacts of a third die to second contacts of the first die. The method also includes bonding the second die to the first die using the first contacts of the first die, and bonding the third die to the first die using the second contacts of the first die. The method also includes encapsulating the second die and the third die in a dielectric material. The method also includes forming a first opening and a second opening in the dielectric material. The method also includes filling the first opening and the second opening with a conductive material to form a through via in the first opening and a first passive device in the second opening.

A device is provided in accordance with some embodiments. The device includes a second die bonded to a first die and a third die bonded to the first die. The device also includes an isolation material extending along sidewalls of the second die and the third die. A through via extends from the first die into the isolation material. A passive device is disposed in the isolation material, where the passive device is electrically connected to the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die, the first die comprising a first electrical connector, a second electrical connector, and a third electrical connector;
   a second die bonded to the first die, wherein the first electrical connector of the first die directly contacts a first electrical connector of the second die;
   an isolation material extending along sidewalls of the second die and a surface of the first die;
   a through via extending into the isolation material from the second electrical connector of the first die; and
   a first passive device contacting the third electrical connector of the first die, the isolation material extending along sidewalls of the first passive device.

2. The semiconductor device according to claim 1, further comprising:
   a third die overlying the first die next to the second die.

3. The semiconductor device according to claim 2, wherein the first die further comprises a fourth electrical connector, and a first electrical connector of the third die directly contacts the fourth electrical connector of the first die.

4. The semiconductor device according to claim 1, wherein a dielectric layer of the first die is directly bonded to a dielectric layer of the second die.

5. The semiconductor device according to claim 1, wherein the first electrical connector, the second electrical connector, and the third electrical connector of the first die are positioned along a same surface of the first die.

6. The semiconductor device according to claim 1, wherein a perimeter of the second die and a perimeter of the first passive device are within a perimeter of the first die in a plan view.

7. The semiconductor device according to claim 1, further comprising:
   a second passive device overlying the first die, wherein the isolation material extends along sidewalls of the second passive device.

8. The semiconductor device according to claim 7, wherein a perimeter of the second passive device is within a perimeter of the first die in a plan view.

9. A semiconductor device, comprising:
   a first die; and
   a second die directly bonded to the first die, wherein a perimeter of the second die is within a perimeter of the first die in a plan view;
   a first passive device, wherein the first passive device directly contacts the first die and is disposed next to a first sidewall of the second die; and
   a second passive device, wherein the second passive device directly contacts the first die, and is disposed next to a second sidewall of the second die.

10. The semiconductor device according to claim 9, wherein the first sidewall of the second die is perpendicular to the second sidewall of the second die.

11. The semiconductor device according to claim 9, further comprising an isolation material overlying the first die and extending along sidewalls of the first passive device and the second passive device.

12. The semiconductor device according to claim 11, wherein a sidewall of the isolation material is level with a sidewall of the first die.

13. The semiconductor device according to claim 9, wherein the first passive device is an inductor, and the second passive device is an antenna.

14. The semiconductor device according to claim 9, wherein the first die comprises a first electrical connector disposed in a first dielectric layer, the second die comprises a second electrical connector disposed in a second dielectric layer, and the second die being directly bonded to the first die comprises the first electrical connector being directly bonded to the second electrical connector and the first dielectric layer being directly bonded to the second dielectric layer.

15. A semiconductor device, comprising:
a plurality of second dies directly bonded to a first die;
an isolation material on the first die, the isolation material extending along sidewalls of the plurality of second dies;
a plurality of through vias extending from the first die into the isolation material, each through via of the plurality of through vias having a same thickness; and
a plurality of passive devices disposed in the isolation material and contacting the first die, wherein a thickness of each passive device of the plurality of passive devices is the same as the thickness of each through via of the plurality of through vias.

16. The semiconductor device according to claim 15, wherein a thickness of the isolation material is the same as the thickness of each passive device of the plurality of passive devices.

17. The semiconductor device according to claim 15, wherein the plurality of passive devices comprises an antenna, an inductor, or a coupler.

18. The semiconductor device according to claim 15, wherein a perimeter of each passive device of the plurality of passive devices is within a perimeter of the first die in a plan view.

19. The semiconductor device according to claim 15, wherein a sidewall of the isolation material is level with a sidewall of the first die.

20. The semiconductor device according to claim 15, wherein a material of each passive device of the plurality of passive devices is the same as a material of each through via of the plurality of through vias.

* * * * *